United States Patent [19]

Fuse et al.

[11] Patent Number: 4,920,390
[45] Date of Patent: Apr. 24, 1990

[54] SEMICONDUCTOR MEMORY DEVICE AND METHOD OF FABRICATING THE SAME

[75] Inventors: Genshu Fuse; Toshio Yamada, both of Hirakata; Shinji Odanaka, Sakai; Masaki Fukumoto, Osaka, all of Japan

[73] Assignee: Matsushita Electric Industrial Co., Ltd., Osaka, Japan

[21] Appl. No.: 218,456

[22] Filed: Jul. 7, 1988

Related U.S. Application Data

[63] Continuation of Ser. No. 877,968, Jun. 24, 1986, abandoned.

[30] Foreign Application Priority Data

Jul. 2, 1985 [JP] Japan .................................. 60-145568
Sep. 6, 1985 [JP] Japan .................................. 60-198076

[51] Int. Cl.[5] .............................................. H01L 29/78
[52] U.S. Cl. ..................................... 357/23.6; 357/55; 357/49
[58] Field of Search .................... 357/23.6, 55, 41, 51, 357/49

[56] References Cited

U.S. PATENT DOCUMENTS

| | | | |
|---|---|---|---|
| 4,353,086 | 10/1982 | Jaccodine | 357/51 |
| 4,672,410 | 6/1987 | Miura | 357/23.6 |
| 4,717,942 | 1/1988 | Nakamura | 357/23.6 |
| 4,786,954 | 11/1988 | Morie et al. | 357/55 |

FOREIGN PATENT DOCUMENTS 59-72161 4/1984 Japan .................................. 357/55 C

OTHER PUBLICATIONS

International Electron Device Meeting, Dec. 1984, pp. 240-243, by Nakajima, #9.4.
International Electron Devices Meeting, Dec. 1984, pp. 244-247, by Wada, #9.5.
International Electron Device Meeting, Dec. 1984, pp. 236-239, by Nakamura.

Primary Examiner—Andrew J. James
Assistant Examiner—Mark Prenty
Attorney, Agent, or Firm—Wenderoth, Lind & Ponack

[57] ABSTRACT

A semiconductor memory device (DRAM) includes a plurality of island regions, at least one cell transistor disposed on each island region and a cylindrical capacitor surrounding each island region. With such a structure, the capacity of the cell capacitor incorporated into a small space can be increased. Furthermore, a method of fabricating a semiconductor memory device includes a step of forming a groove having a necessary depth in a semiconductor substrate, a step of depositing a membrane having excellent covering characteristics in the groove, a step of etching by using an etching method having a strong anisotropy in the vertical direction while leaving the deposited membrane on a sidewall, and a step of etching the exposed portion of the semiconductor surface deeper in the groove and forming a capacity element and isolation region by using this deep trench.

13 Claims, 19 Drawing Sheets a-a' Section b-b'Section

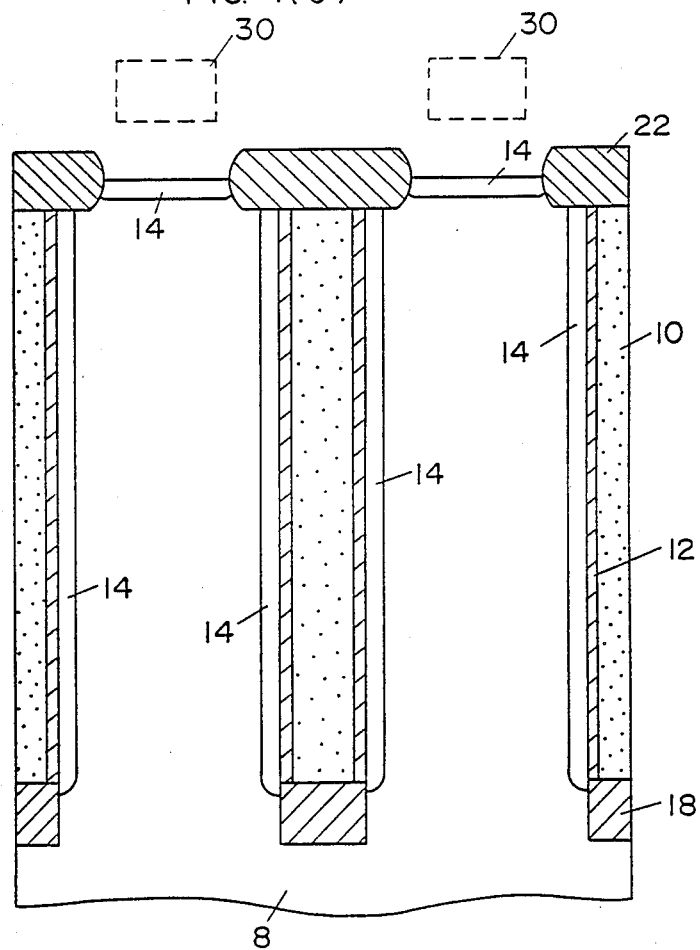

d-d' Section e-e' Section f-f' Section g-g' Section h-h' Section i-i' Section

SEMICONDUCTOR MEMORY DEVICE AND METHOD OF FABRICATING THE SAME

This application is a continuation of now abandoned application Ser. No. 877,968, filed June 24, 1986.

BACKGROUND OF THE INVENTION

1. Field of the Invention

This invention relates to a semiconductor memory device and a method of-fabricating the same, and more particularly to a semiconductor memory device such as a DRAM having a large capacity capacitor formed in a small space, and a method of fabricating such a capacitor easily.

2. Description of the Related Art

For a dynamic memory (DRAM), a storage capacitor and a cell transistor are indispensable, and to more highly integrate the memory, it is necessary to reduce the area of storage capacitor. However, the preventing of soft errors caused by alpha-particle or noise, advantageously results when the capacity of the storage capacitor is larger. To solve this contradiction, it has been attempted to etch grooves in the silicon substrate and use the sidewall of the grooves as storage capacitor. One of the examples of this structure was proposed as "Structure sharing the isolation layer and storage capacitor in a dynamic RAM" at lecture numbers 9.3, 9.4, 9.5 at the International Electron Device Meeting (IEDM) held in the United States in December 1984. This proposal is unique in that the storage capacitor and the isolation layer are fabricated in one common groove. That is, by forming the storage capacitor on the sidewall of a groove, its area is increased. The devices are isolated by the bottom of the groove.

In the conventional memory cell structure in this example, the storage capacitor is formed at the side of a cell transistor, at a position isolated from this transistor. Accordingly, to directly and more higher integrate this memory cell structure, it is necessary to etch the groove deeper, which may give rise to difficulty in the fabricating process. Besides, because of its specific structure, the process may be extremely complicated.

SUMMARY OF THE INVENTION

It is hence a primary object of this invention to present a semiconductor memory device in an easy-to-fabricate composition, with a large capacity cell capacitor realized in a small space, by forming a substantially cylindrical cell capacitor so as to surround an island region which forms a cell transistor.

It is another object of this invention to manufacture a semiconductor memory device including this substantially cylindrical cell capacitor easily by employing existing manufacturing technology.

These and other objects are accomplished by a semiconductor memory device according to the invention, of which device includes plural island regions, at least one cell transistor provided in each island region, and a substantially cylindrical cell capacitor disposed so as to surround said each island region.

In a first illustrative embodiment, two cell transistors are formed in each island region, and these two cell transistors are isolated by an insulation layer, and by this insulation layer, said cell capacitor is separated into two halves.

In a second illustrative embodiment, only one cell transistor is formed in each island region.

In a third illustrative embodiment, said cell capacitor is comprised of a cylindrical first electrode, a cylindrical second electrode, and a cylindrical dielectric layer which extends between said first and second electrodes.

In a fourth illustrative embodiment, one of a source a drain which make up said cell transistor is integrally formed together with one of said first and second electrodes.

In the first illustrative embodiment, a shallow isolation region is formed at the end wall of said cylindrical cell capacitor, and by this isolation region, the source, drain, and channel portions of said transistor are isolated from the capacitor. The isolation region is disposed either at both side edges of the end wall of the cylindrical capacitor, or at one side edge of the end wall of the cylindrical capacitor.

This invention further relates to a method of fabricating a semiconductor memory device characterized by a step of forming grooves in a semiconductor substrate, a step of depositing a membrane having excellent covering characteristics to the inside of said grooves, a step of etching said deposit membrane by an etching method having a strong anisotropy in the vertical direction to leave said deposit membrane only on the sidewall of said grooves, and a step of etching the exposed portions of the semiconductor substrate surface deeply in the grooves to form a semiconductor memory device by using this deeply etched groove portion as part of a capacity element or isolation region. The membrane excelling in coverage is an insulation film. An electrode is formed, by way of a thin insulation film, in the groove formed by the second silicon etching, and it is used as a cell capacitor.

According to the present invention as described herein, the following benefits, among others, are obtained:

(1) Since the substantially cylindrical cell capacitor is formed in a manner to surround the island region which forms a cell capacitor, a cell capacitor having a large capacity can be realized in a small space, and the integration of the semiconductor memory device may be further heightened in a state free from soft errors.

(2) Since the groove formation in the semiconductor substrate is divided into two steps and a cell capacitor can be easily formed in this groove, the semiconductor memory device can be fabricated by conventional manufacturing technology.

While the novel features of the invention are set forth with particularity in the appended claims, the invention, both as to organization and content, will be better understood and appreciated, along with other objects and features thereof, from the following detailed description taken in conjunction with the drawings, in which:

DETAILED DECRIPTION OF THE PREFERRED EMBODIMENTS

Figure 1A:
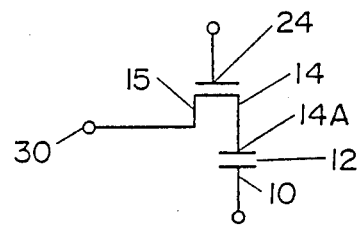
FIG. 1(A) shows an equivalent circuit diagram of a memory cell of the device of the first embodiment.
Figure 1B:
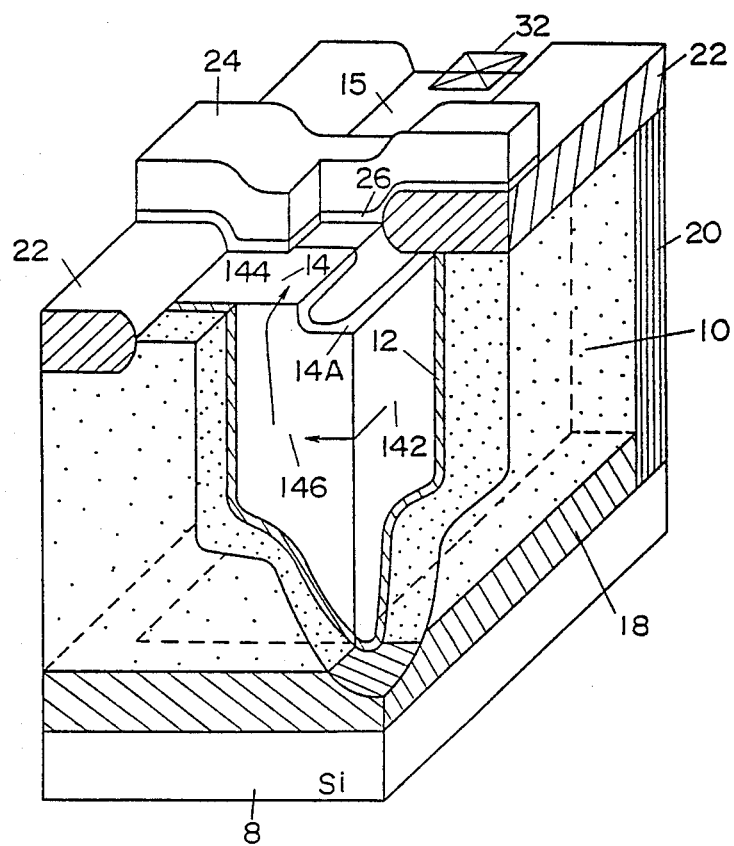
FIG. 1(B) is a perspective view showing a partially cut-away section of a semiconductor memory device in a first embodiment of this invention.
Figure 2:
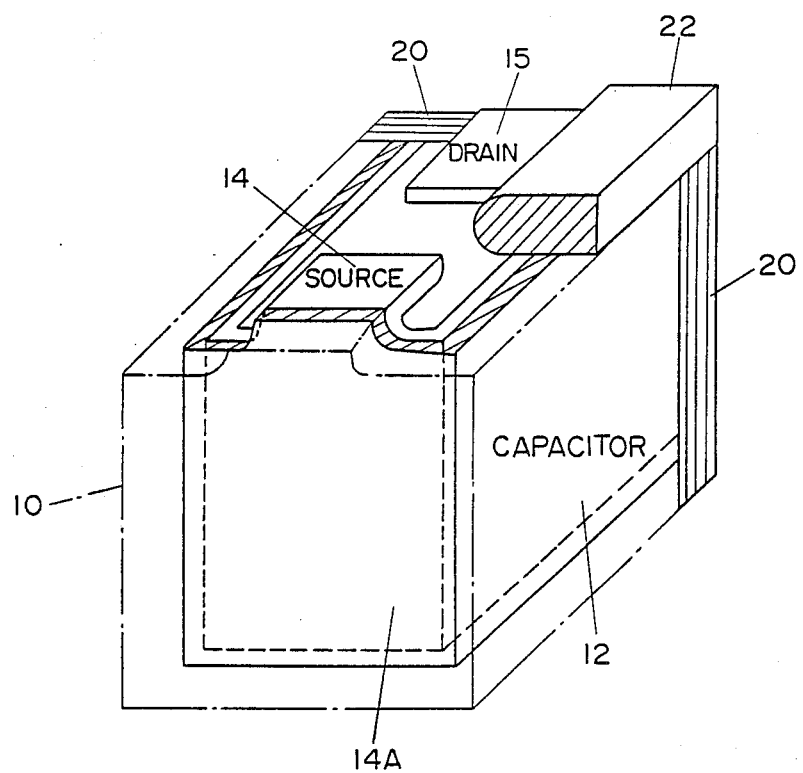
FIG. 2 is a perspective view showing the capacitor portion of the device of the first embodiment.
Figure 3:
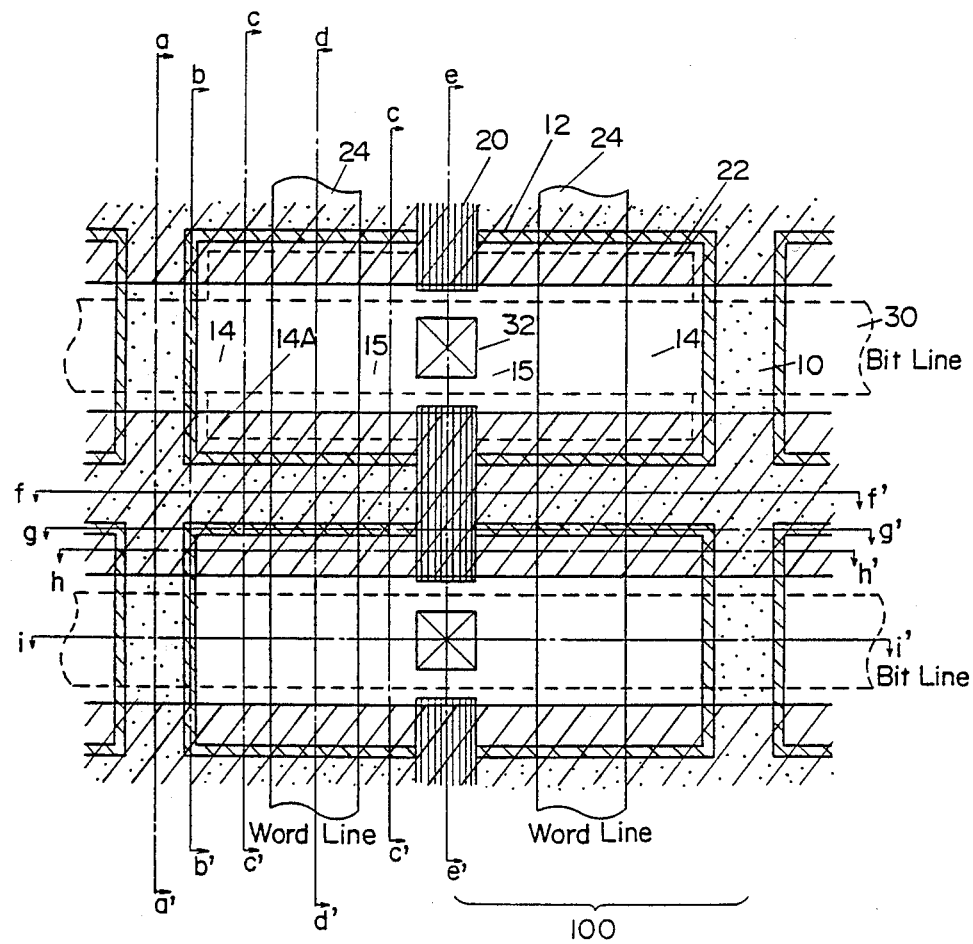
FIG. 3 is a plan view of essential parts of the device in the first embodiment.
Figure 4A:
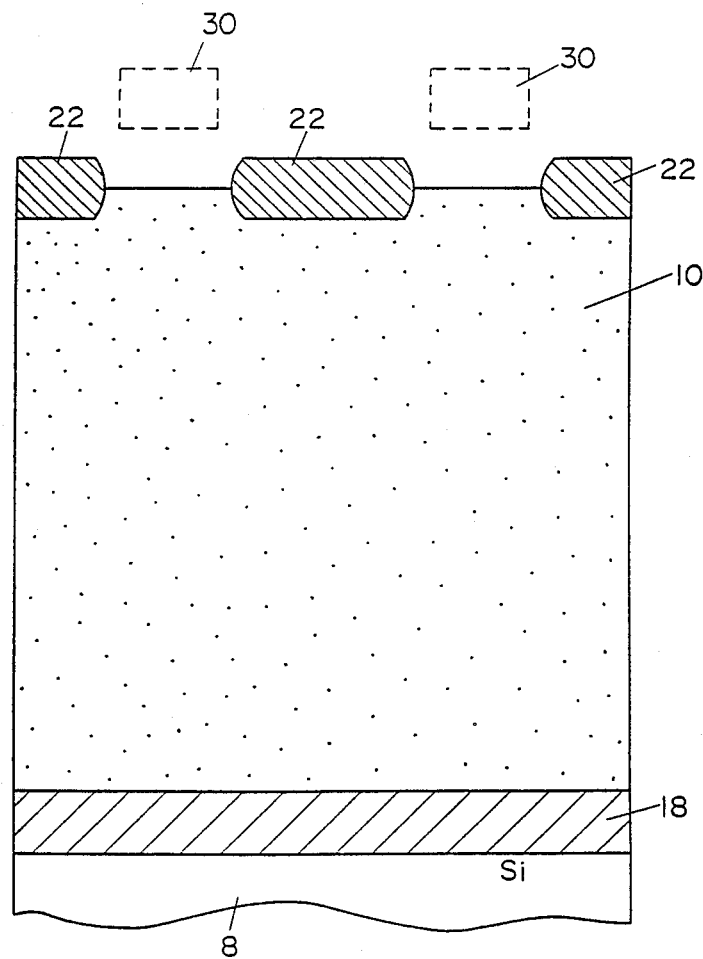
FIG. 4(A) to (I) are the views taken along lines a-a' to i-i' respectively, in FIG. 3.
Figure 4B:
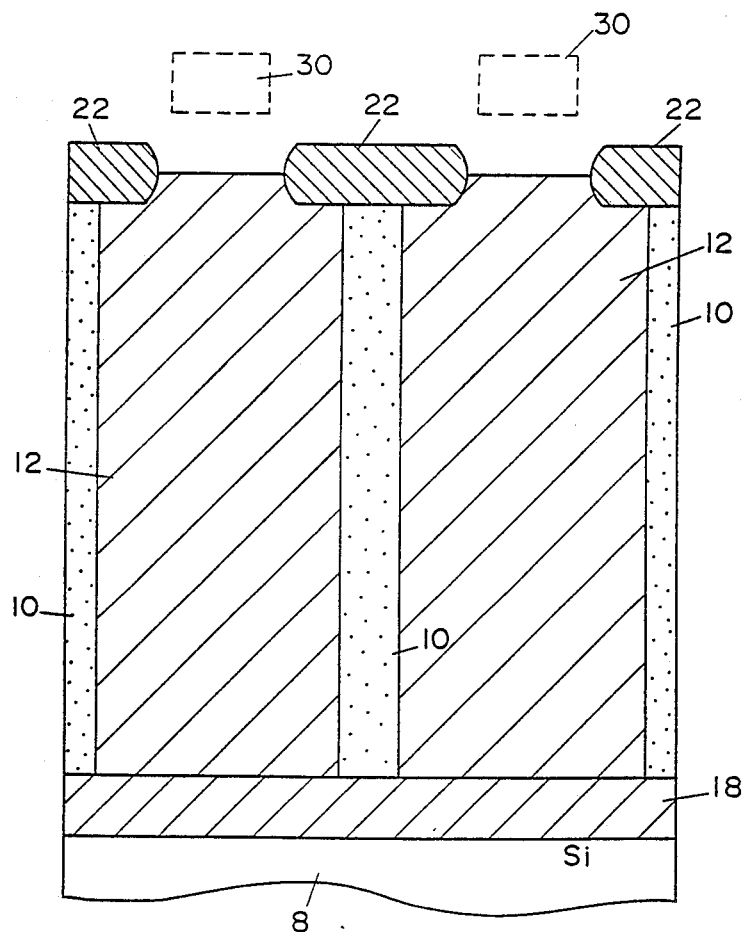
Figure 4D:
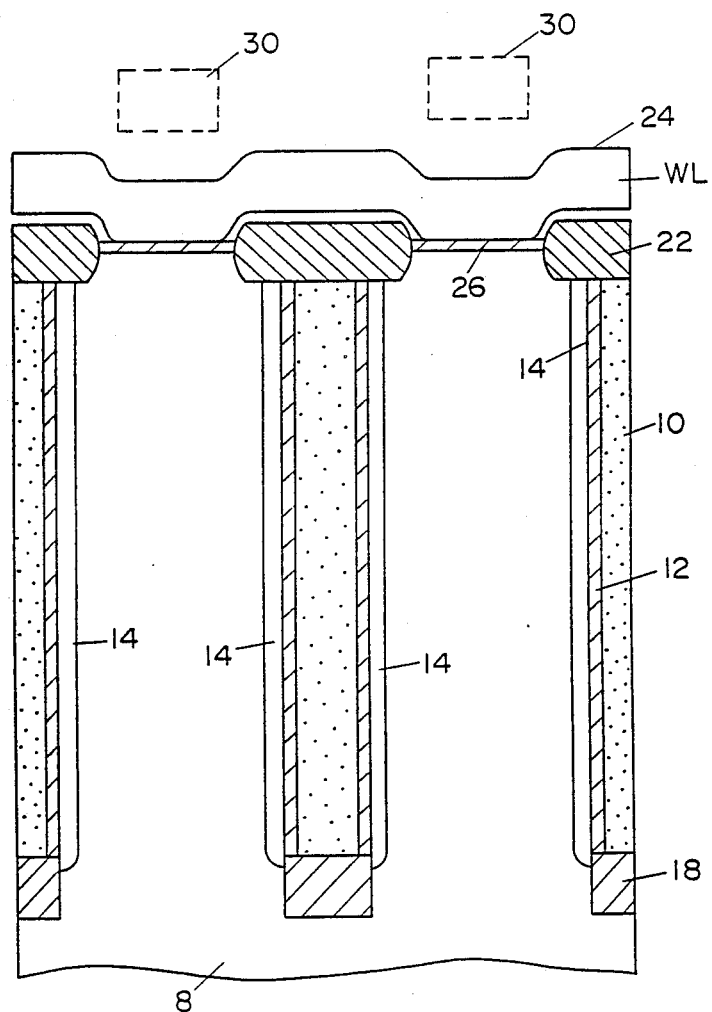
Figure 4E:
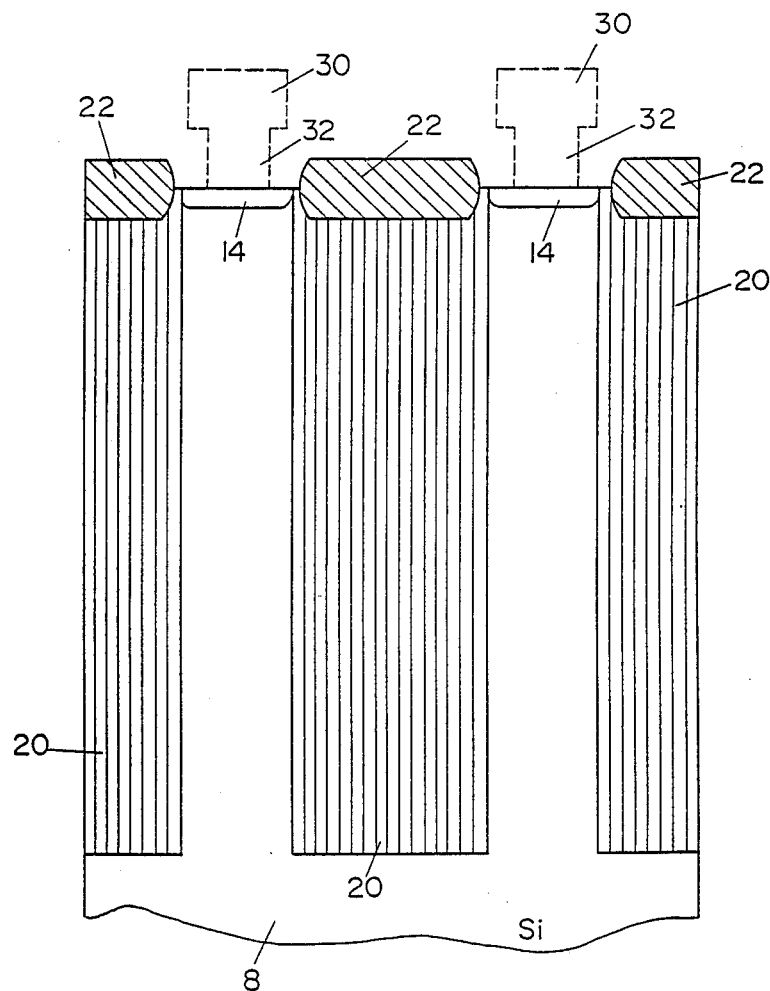
Figure 4F:
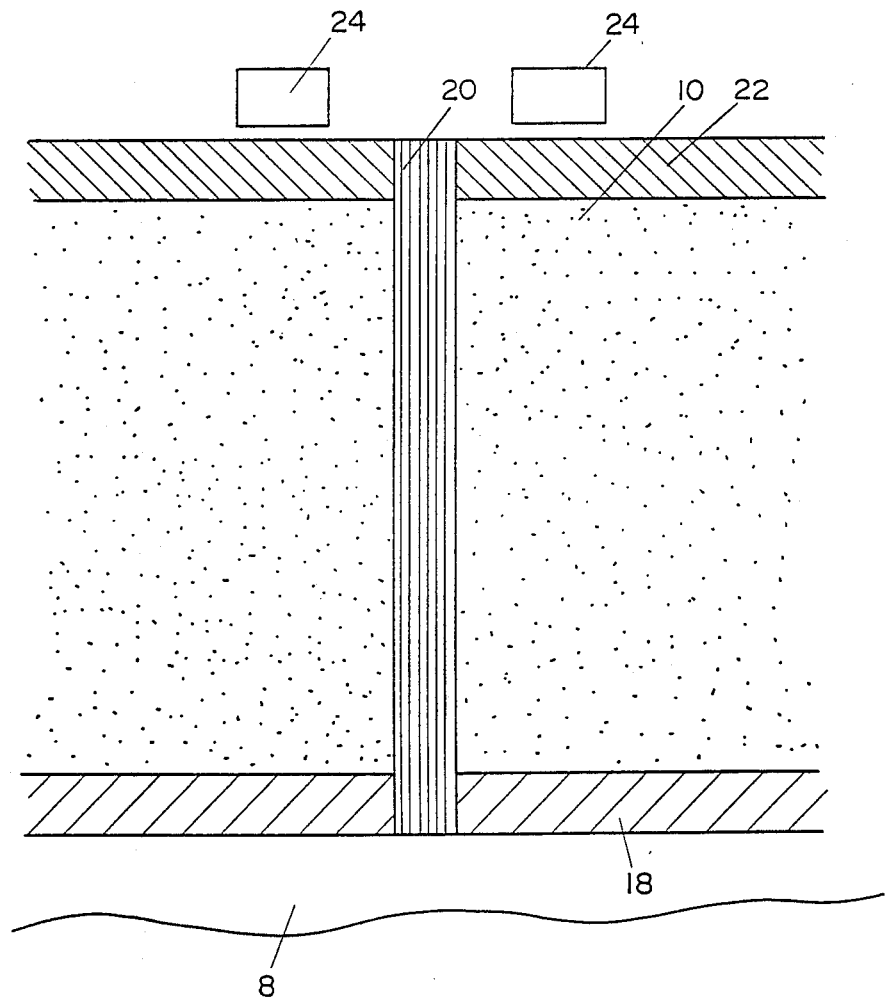
Figure 4G:
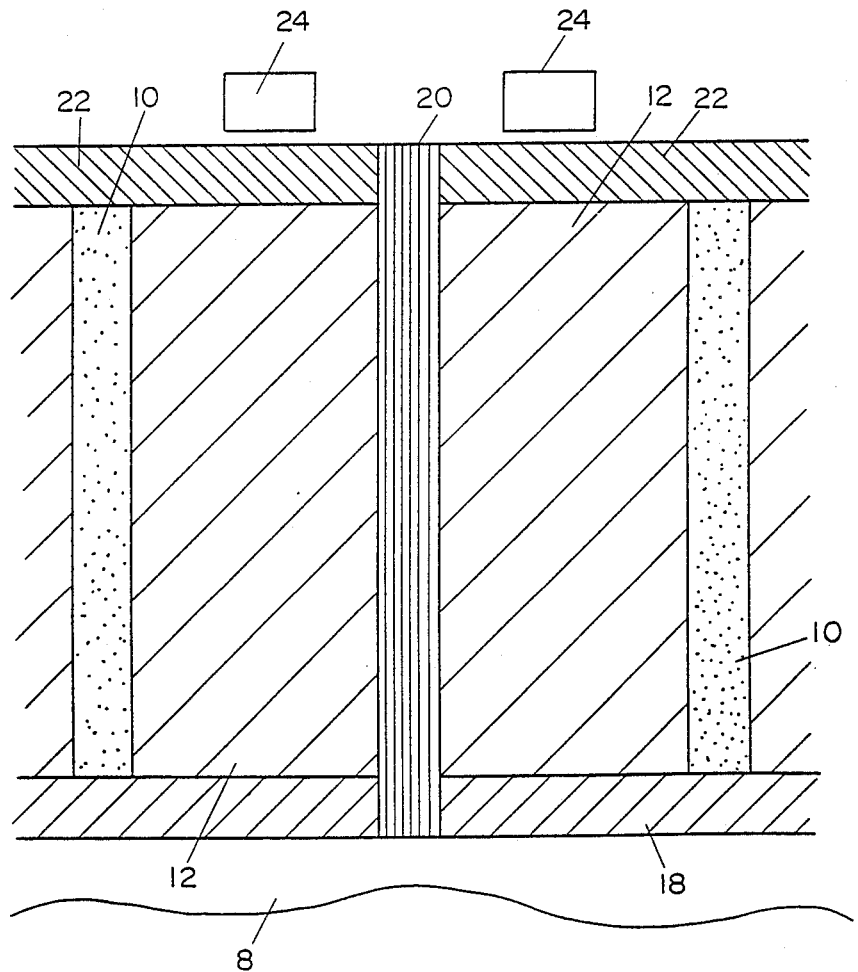
Figure 4H:
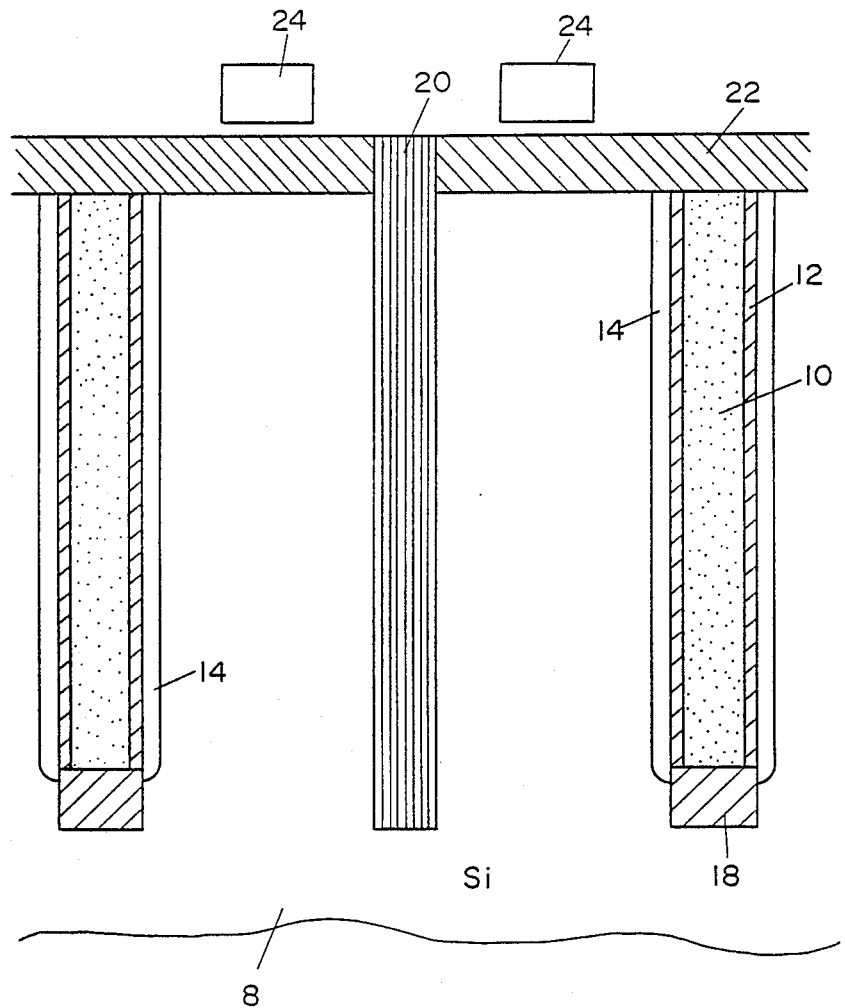
Figure 4:
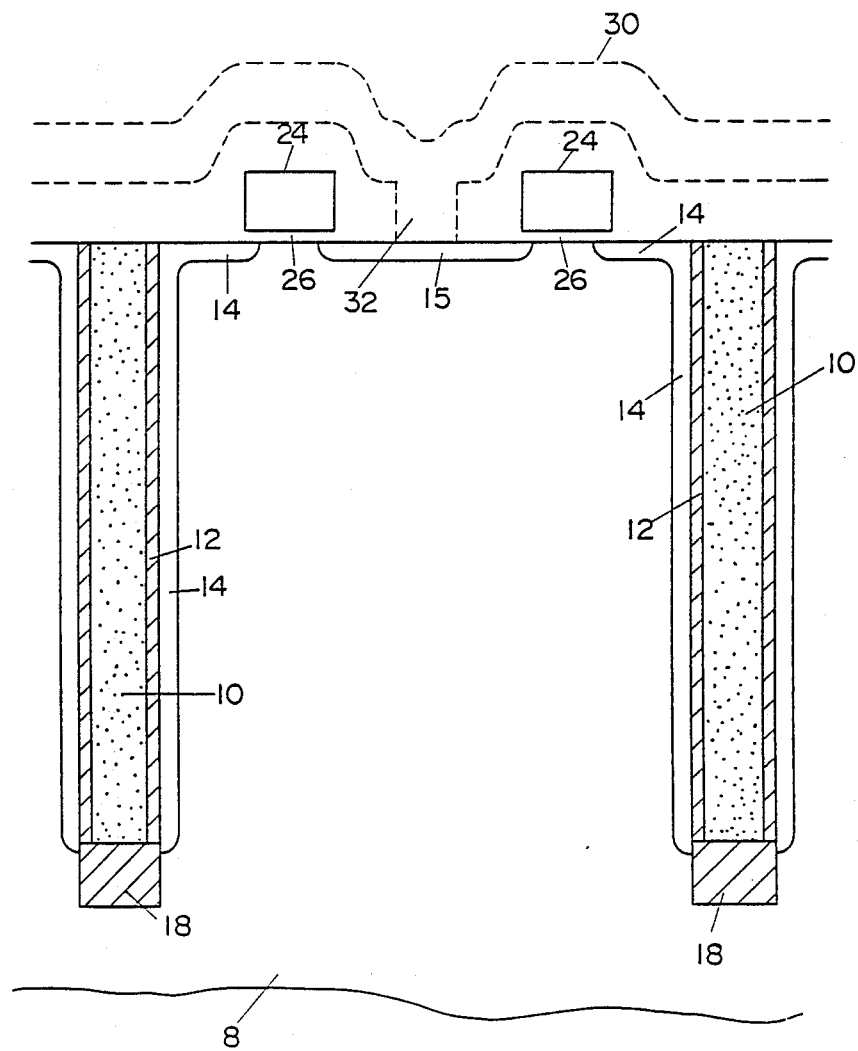

FIG. 1 to FIG. 4 show a DRAM according to a first embodiment of this invention. FIG. 1(B) is a partially cut-away sectional view of one of its cells, and FIG. 1(A) is its equivalent circuit diagram. FIG. 2 is a perspective view of its capacitor portion. FIG. 3 is a plan view of the same DRAM, in which one island region is insulated and isolated in the middle to be divided into two parts, and a cell transistor and a cell capacitor are incorporated into each part. FIGS. 4 (A) to (I), respectively, show sectional views taken along lines a-a' to i-i' of FIG. 3. FIG. 1 corresponds to region 100 in FIG. 3. In FIG. 1, incidentally, a metal wiring layer 30 corresponding to bit line and the contact part 32 between the metal wiring layer 30 and diffusion layer 15 in FIG. 3 are not shown.

Referring to these drawings, the structure and operation of the first embodiment will be described. As is clear from FIG. 3, one island region in which two memory cells are incorporated is surrounded by a fixed electrode 10 of a cylindrical storage cell capacitor, and between this fixed electrode 10 and cylindrical diffusion layer 14 is positioned a cylindrical dielectric layer 12 which serves as the dielectric of the storage capacitor. In the bottom 18 of the fixed electrode 10 of the storage capacitor comprised of a conductive polycrystal silicon membrane or the like, a channel stopper selectively forming a substrate of relatively high concentration and similar conductive impurities or an oxide having a relatively thick membrane is buried in order to electrically isolate the adjacent storage capacitors in the memory cell. Numeral 8 denotes a silicon substrate. One cell transistor comprises diffusion layers 14, 15 which serve as source, drain, and also gate electrode 24 and gate oxide membrane 26. Immediately beneath the gate electrode 24 is a shallow insulated isolation region 22 a storage capacitor. As shown in FIG. 1, the shallow insulated isolation region 22 functions to electrically isolate the sidewall diffusion layer 142 in the diffusion layer 14A, serving as the capacitor electrode for storing signal electric charge, from the upper diffusion layer 144 (14) formed integrally with this diffusion layer 14A and MOS transistor channel portion. The accumulated signal electric charge in the diffusion layer 14 flows, as indicated by arrow in FIG. 1, from the sidewall diffusion layer 142, side wall diffusion layer 146 to upper diffusion layer 144, and is read out into bit line 30 by way of diffusion layer 15 and contact portion 32 through transistor. The deep isolation region 20 is for electrically isolating two memory cells sharing the same contact portion, out of the memory cells adjacent in the direction of bit line 30, and is formed by selectively burying an insulation membrane such as a SiO$_2$ film. Or, a channel stopper may be selectively formed on the surface of silicon substrate on the sidewall of a groove.

Thus, the semiconductor memory device of the first embodiment is intended to electrically isolate two memory cells, by forming cylindrical cell capacitors around an island region in which two memory cells are incorporated, and separating this island region by an insulation layer 20. According to this constitution, a cell capacitor can be formed also in the cell transistor which makes up a memory cell, especially beneath its gate electrode, so that the capacity of the cell capacitor may be increased.

Figure 5:
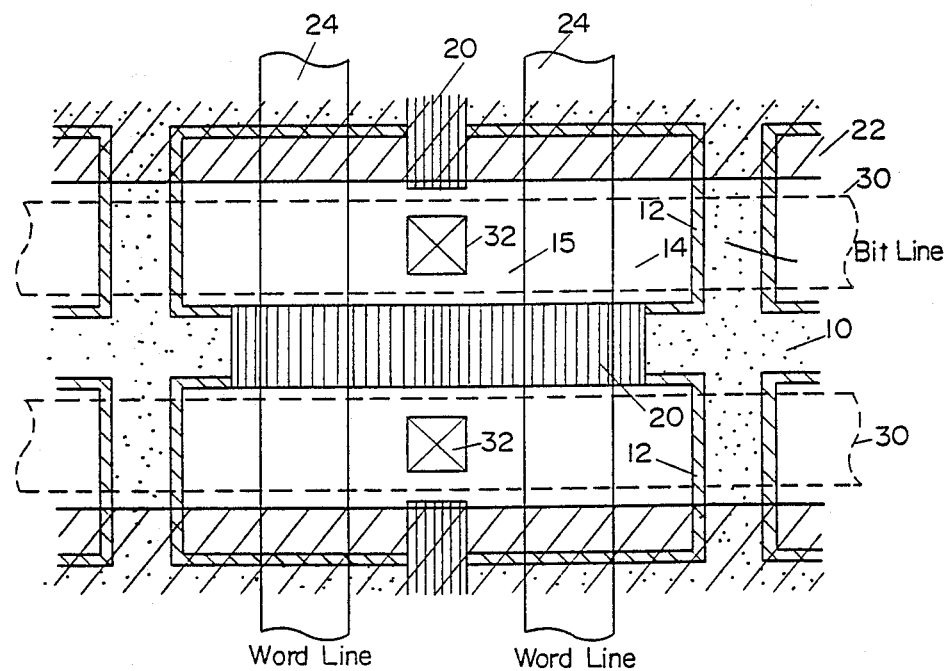
FIG. 5 is a plan view of a semiconductor memory device according to a second embodiment of this invention.

A plan view of a second embodiment of this invention is shown in FIG. 5. What is different from the first embodiment is that the cell capacitor formed immediately beneath the gate electrode 24 is disposed at only one side. That is, in the first embodiment, insulated isolation regions are formed at both sides of the end plane of cylindrical capacitor, while in the second embodiment, it is formed only at one side. Thus, since the cell capacitor is formed only at one side, only one shallow insulated isolation layer 22 is needed to form a cell transistor, which means that the area of the memory cell is smaller than that in the first embodiment.

Figure 6:
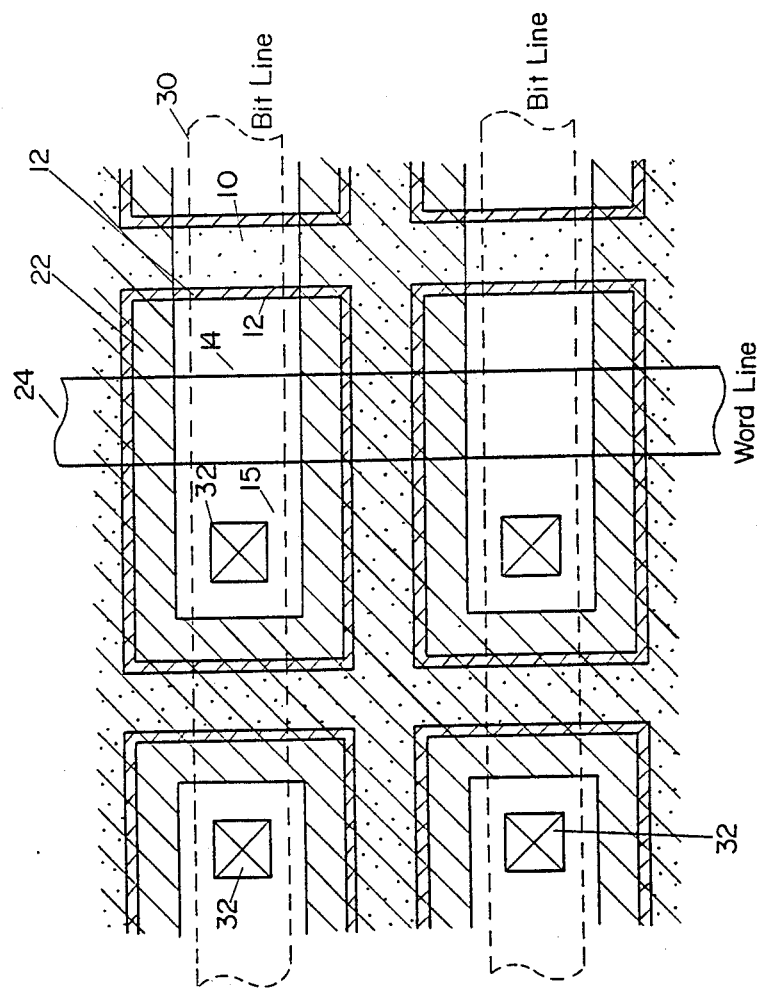
FIG. 6 is a plan view of semiconductor memory device in a according to a third embodiment of this invention.

A plan view of a third embodiment of this invention is shown in FIG. 6. What is different from the first embodiment is that the entire circumference of one memory cell is used as the storage cell capacitor by disposing one contact portion 32 in each memory cell. As a result, the area of the storage cell capacitor per memory cell can be increased as compared with the first embodiment. Furthermore, as compared with the first embodiment, since the deep insulated isolation layer 20 for isolating the cells is not needed, the manufacturing process may be simplified.

Figure 7:
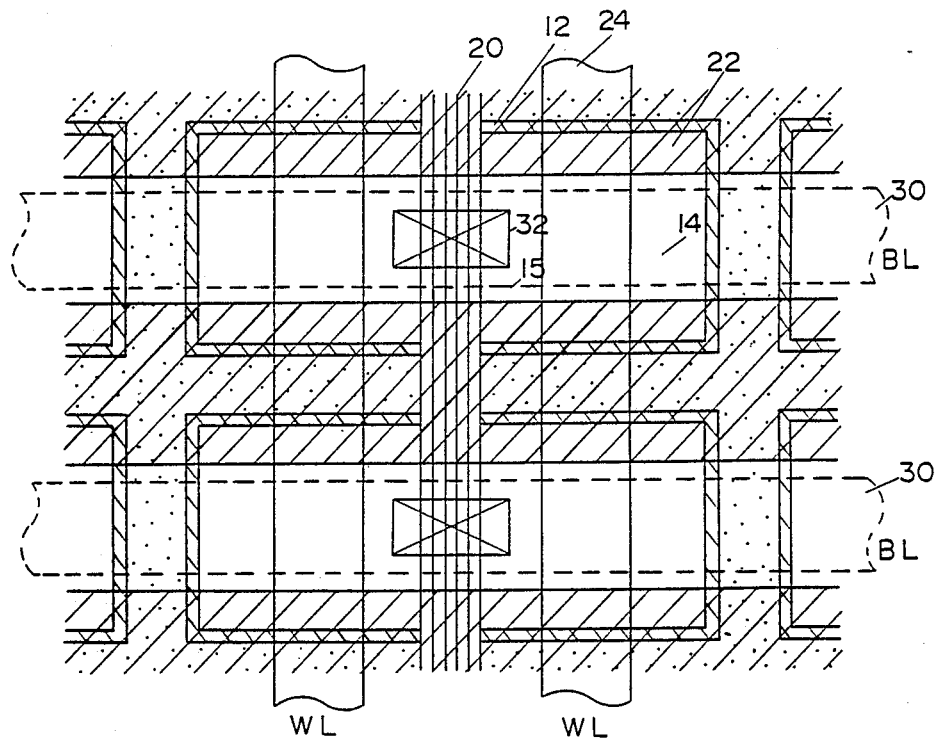
FIG. 7, FIG. 8 are plan views of semiconductor memory device according to fourth and fifth embodiments of this invention.

A plan view of a fourth embodiment of this invention is shown in FIG. 7. What is different from the first embodiment is that the diffusion capacity of the contact portion can be reduced by forming a deep isolation groove 20 filled with SiO$_2$ film or the like immediately beneath the contact portion 32. As a result, a greater read-out voltage is realized.

Figure 8:
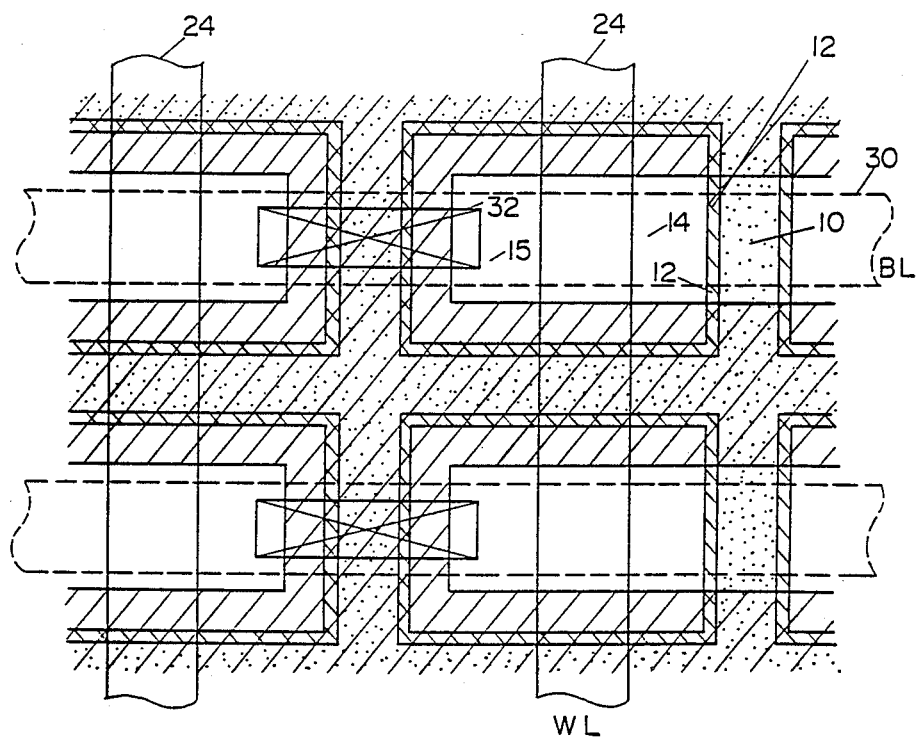

A plan view of a fifth embodiment of this invention is shown in FIG. 8. This is to reduce the area using the contact hole 32 commonly shared by adjacent cell transistors in the third embodiment.

Thus, by these embodiments, the area of the storage capacitor relative to the memory cell area can be significantly increased as compared with the prior art.

The fabricating method of this invention is described below while referring to a practical embodiment.

FIGS. 9(a) to (e) illustrate the steps of this fabricating method. At step (a), an SiO$_2$ film 42 used as an oxide film for resist masking was formed on a P-type Si substrate 41 (corresponding to numeral 8 in FIG. 8), and a groove G about 0.5 $\mu$m deep was formed in the Si substrate 41 by etching. In this groove, by injecting n-type ions in some part and n-type ions in the other parts, including the wall of the groove, by ion beams 43, an n+ region 14' and a p+ region 45 were fabricated. In step (b), as an oxide film, an SiO$_2$ deposit film 46 having excellent covering characteristics was formed by using a reduced pressure CVD process. In step (c), by etching the surface using a cathode coupling parallel plate type dry etching process (RIE process) using C$_3$F$_8$ gas, only the SiO$_2$ deposit film 46 was left on the sidewall of the groove. Numeral 47 denotes this remaining SiO$_2$ film. In step (d), the Si substrate 41 was etched again by using a RIE process to a depth of about 4 μm, thereby forming groove G2 after groove G. By introducing the impurities of n+, an n+ region 14 was formed, and a p+ region 18 was formed in the bottom of groove G2. Both the n+ region 14A and the p+ region 18 were formed by using an ion implantation process. Portion A shown at the right side of this process chart is covered with $SiO_2$ film 47 as a particular oxide film, so that it is completely free from effects when doping various impurities. The essential point of this invention is the $SiO_2$ film 47 left over on this vertical wall.

In the next step (e), the fabrication is nearly finished. Numeral 10 is polysilicon buried and formed in the groove. In portion A', gate electrode 24, n+ region source 14, and n+ region drain 15 are formed, and a MOS transistor having a wiring electrode 32 is shown, while portion B' refers to a cell capacitor having polysilicon 10 as a buried electrode, with a 10 nm thick thin oxide film 12 buried as a capacitor insulation film. Furthermore, in portion A', $SiO_2$ is buried to act as an insulation film.

The source electrode of this MOS transistor and cell capacitor portion are electrically connected with each other by means of the n+ region 14' formed in step (a), while the drain region 15 and the n+ region 14 as the other electrode portion of the capacitor are separated by the p+ region formed in step (a).

Figure 9A:
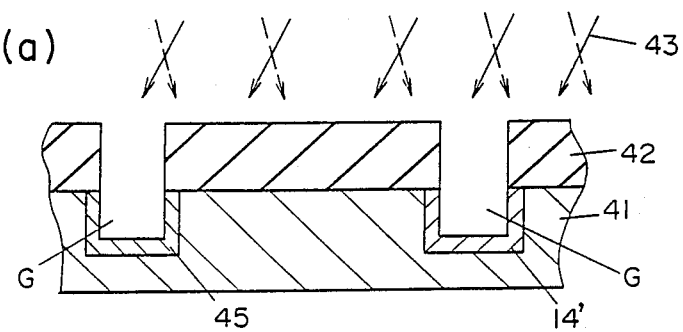
FIG. 9 is a sectional view showing the manufacturing process in a practical embodiment of this invention.
Figure 9B:
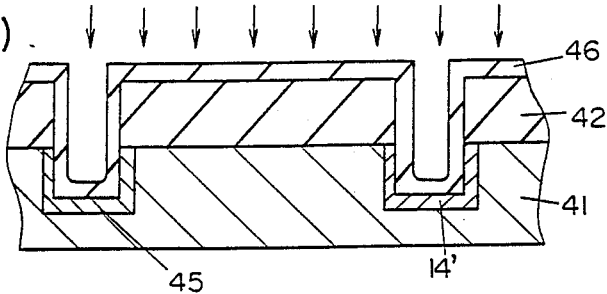
Figure 9C:
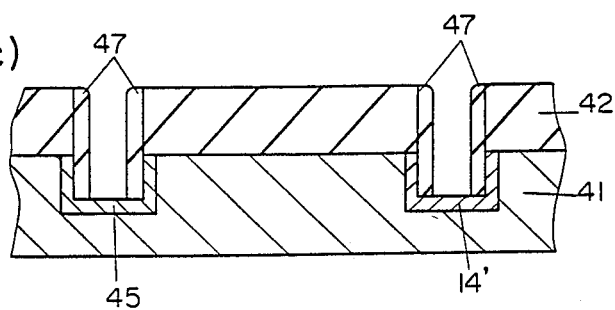
Figure 9D:
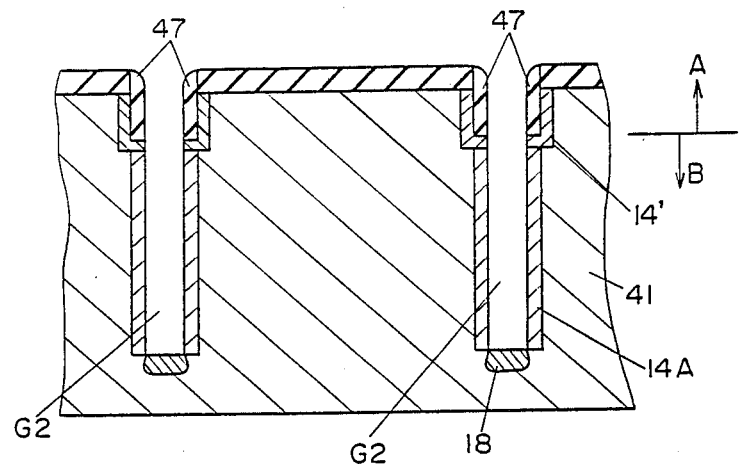
Figure 9E:
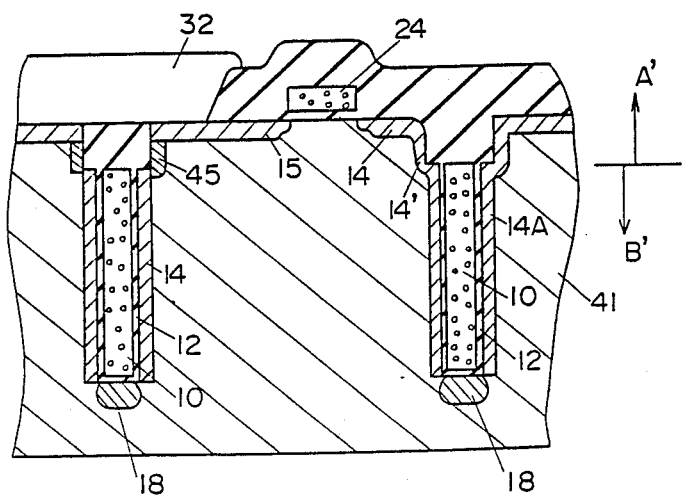
Figure 10:
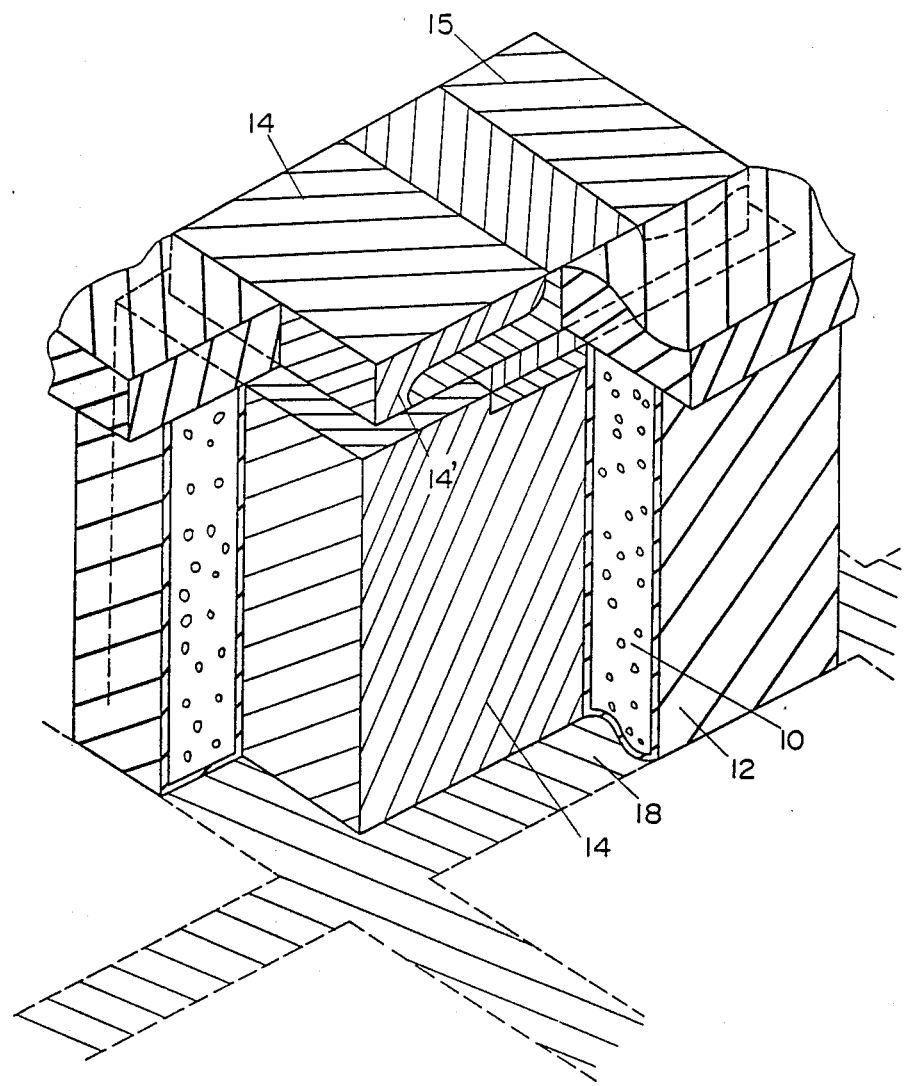
FIG. 10 is a perspective view showing, in a partial section, the structure of a dynamic cell fabricated by the method of this invention.

In FIG. 10, a solid view of the transistor portion of a dynamic memory cell fabricated by this process is shown corresponding to FIG. 9(e). Meanwhile, the gate of MOS transistor and electrode, wiring and protective film on it are omitted in the drawings.

What we claim is:

1. A semiconductor memory device comprising:
   a semiconductor substrate having an upper surface and at least one groove therein, each said at least one groove extending around a part of said substrate and including a first groove portion proximate the upper surface of said substrate and a second groove portion extending from the bottom of said first groove portion to a location disposed within said substrate, the part of the substrate around which said at least one groove extends defining a respective island region, said island region including a first portion around which said first groove portion extends and a second portion around which said second groove portion extends;
   a first electrode of a storage cell capacitor extending in each said second groove portion;
   a dielectric layer of the storage cell capacitor disposed between said first electrode and the second portion of said island region;
   a second electrode of the storage cell capacitor extending between and in contact with an outer circumferential side surface of the second portion of said island region and said dielectric layer;
   an electrical insulating isolation layer disposed in and extending over the first groove portion of said at least one groove;
   an MOS transistor having source, drain and channel regions and disposed at the first portion of said island region adjacent said electrical insulating isolation layer;
   a connection region disposed alongside part of the first portion of said island region adjacent said dielectric layer, said connection region extending substantially vertically from said second electrode to one of said drain and said source regions of the MOS transistor for operatively conductively connecting said second electrode to said one of said source and said drain regions; and
   a separation region disposed alongside another part of the first portion of said island region adjacent said dielectric layer, said separation region extending substantially vertically from said second electrode to the other of said drain and said source regions of the MOS transistor for operatively electrically insulating said second electrode from said other of said source and said drain regions.

2. A semiconductor memory device as claimed in claim 1,
   and further comprising a bit line in operative electrical contact with said other of said source and said drain electrodes.

3. A semiconductor memory device as claimed in claim 1,
   wherein said dielectric layer extends along the bottom of the second groove portion of said at least one groove at said location, and further comprising a channel stopper extending below the second groove portion of said at least one groove adjacent said dielectric layer extending along the bottom of the second groove portion of said at least one groove.

4. A semiconductor memory device as claimed in claim 1,
   wherein said first electrode is poly silicon.

5. A semiconductor memory device as claimed in claim 1,
   wherein said electrical insulating isolation layer is $SiO_2$.

6. A semiconductor memory device as claimed in claim 2,
   wherein the device comprises at least two said island regions;
   and further comprising a contact region extending between and common to adjacent ones of the at least two island regions, and the bit line is in operative electrical contact with said contact region.

7. A semiconductor memory device comprising:
   a semiconductor substrate having an upper surface and at least one groove extending therein, each said at least one groove extending around a part of said substrate and inlcuding a first groove portion proximate the upper surface of said substrate and a second groove portion extending from the bottom of said first groove portion to a location disposed within said substrate, the part of the substrate around which said at least one groove extends defining a respective island region, said island region including a first portion around which said first groove portion extends and a second portion around which said second groove portion extends;
   a first electrode of a storage cell capacitor extending in each said second groove portion;
   a dielectric layer of the storage cell capacitor disposed between said first electrode and the second portion of said island region;
   a second electrode of the storage cell capacitor extending between and in contact with an outer circumferential side surface of the second portion of said island region and said dielectric layer;
   an electrical insulating isolation layer disposed in and extending over the first groove portion of said at least one groove;

MOS transistors having source, drain and channel regions and disposed at the first portion of said island region adjacent said electrical insulating isolation layer, and the MOS transistors having respective gate electrodes disposed above the island region;

a connection region disposed alongside part of the first portion of said island region adjacent said dielectric layer, said connection region extending substantially vertically between said second electrode and one of said drain and said source regions of each of the MOS transistors for operatively conductively connecting said second electrode to said one of said source and said drain regions;

a separation region disposed alongside another part of the first portion of said island region adjacent said dielectric layer, said separation region extending substantially vertically between said second electrode and the other of said drain and said source regions of each of the MOS transistors for operatively electrically insulating said second electrode from said other of said source and said drain regions; and a deep isolation region extending in said substrate and through said first electrode and said dielectric layer for separating the storage cell capacitor into at least two areas.

8. A semiconductor memory device as claimed in claim 1, and further comprising a bit line in operative electrical contact with said other of said source and said drain electrodes.

9. A semiconductor memory device as claimed in claim 7, wherein said dielectric layer extends along the bottom of the second groove portion of said at least one groove at said location, and further comprising a channel stopper extending below the second groove portion of said at least one groove adjacent said dielectric layer extending along the bottom of the second groove portion of said at least one groove.

10. A semiconductor memory device as claimed in claim 7, wherein said first electrode is poly silicon.

11. A semiconductor memory device as claimed in claim 7, wherein said electrical insulating isolation layer and said deep isolation region are both $SiO_2$.

12. A semiconductor memory device as claimed in claim 8, wherein the device comprises at least two island regions;

and further comprising a contact region extending between and common to adjacent ones of the at least two island regions, and the bit line is in operative electrical contact with said contact region.

13. A semiconductor memory device as claimed in claim 1, wherein the portion of said electrical insulating isolation region that is disposed in the first groove portion adjacent said another part of the first prtion of said isolation region has an uppermost surface and a lowermost surface, said second electrode has an uppermost surface contacting the lowermost surface of said portion of the electrical insulating isolation region at an edge thereof bordering said lowermost surface, and said other of said source and drain regions contacts said portion of said electrical insulating isolation region at an edge thereof bordering said uppermost surface of the portion of the electrical insulating isolation region.

* * * * *